United States Patent
Guan et al.

(10) Patent No.: US 10,451,981 B2
(45) Date of Patent: Oct. 22, 2019

(54) MEASUREMENT SUBSTRATE, A MEASUREMENT METHOD AND A MEASUREMENT SYSTEM

(71) Applicant: ASML NETHERLANDS B.V., Veldhoven (NL)

(72) Inventors: Tiannan Guan, Best (NL); Jingshi Li, Best (NL); Miao Yu, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/343,425

(22) PCT Filed: Sep. 8, 2017

(86) PCT No.: PCT/EP2017/072543
§ 371 (c)(1),
(2) Date: Apr. 19, 2019

(87) PCT Pub. No.: WO2018/077517
PCT Pub. Date: May 3, 2018

(65) Prior Publication Data
US 2019/0243257 A1     Aug. 8, 2019

(30) Foreign Application Priority Data

Oct. 28, 2016 (EP) .................... 16196279

(51) Int. Cl.
*G03F 7/20* (2006.01)
(52) U.S. Cl.
CPC .......... *G03F 7/70783* (2013.01); *G03F 7/708* (2013.01); *G03F 7/7085* (2013.01);
(Continued)

(58) Field of Classification Search
None
See application file for complete search history.

(56) References Cited

U.S. PATENT DOCUMENTS

| 5,444,637 A | 8/1995 | Smesny et al. |
| 2002/0078770 A1 | 6/2002 | Hunter |

(Continued)

FOREIGN PATENT DOCUMENTS

| EP | 1420298 | 5/2004 |
| EP | 1783555 A2 | 5/2007 |

(Continued)

OTHER PUBLICATIONS

International Search Report and Written Opinion issued in corresponding PCT Patent Application No. PCT/EP2017/072543, dated Dec. 14, 2017.

(Continued)

*Primary Examiner* — Michelle M Iacoletti
(74) *Attorney, Agent, or Firm* — Pillsbury Winthrop Shaw Pittman LLP

(57) ABSTRACT

A method of measuring wear of a substrate holder that is configured to hold a production substrate, the method includes: clamping a measurement substrate to the substrate holder; and measuring strain in the measurement substrate to generate a measurement result. The measurement substrate may have a body having dimensions similar to that of the production substrate; and a strain sensor in the body configured to measure strain in a peripheral portion of the measurement substrate.

20 Claims, 5 Drawing Sheets

(52) U.S. Cl.
CPC ...... *G03F 7/70708* (2013.01); *G03F 7/70716* (2013.01); *G03F 7/70825* (2013.01); *G03F 7/70875* (2013.01)

(56) References Cited

U.S. PATENT DOCUMENTS

| | | |
|---|---|---|
| 2004/0207824 A1 | 10/2004 | Lof et al. |
| 2006/0234398 A1 | 10/2006 | Gluschenkov et al. |
| 2012/0249987 A1 | 10/2012 | Vermeulen et al. |
| 2012/0327386 A1 | 12/2012 | Huang et al. |
| 2013/0029433 A1 | 1/2013 | Sun et al. |
| 2013/0162963 A1 | 6/2013 | Spruit et al. |
| 2015/0168852 A1* | 6/2015 | Beerens ............. G03F 7/70775 355/72 |

FOREIGN PATENT DOCUMENTS

| | | |
|---|---|---|
| TW | 201430997 | 8/2014 |
| WO | 2016020170 | 2/2016 |
| WO | 2016192918 | 12/2016 |
| WO | 2017008993 | 1/2017 |

OTHER PUBLICATIONS

Research Disclosure No. 587047, published Feb. 18, 2013.

\* cited by examiner

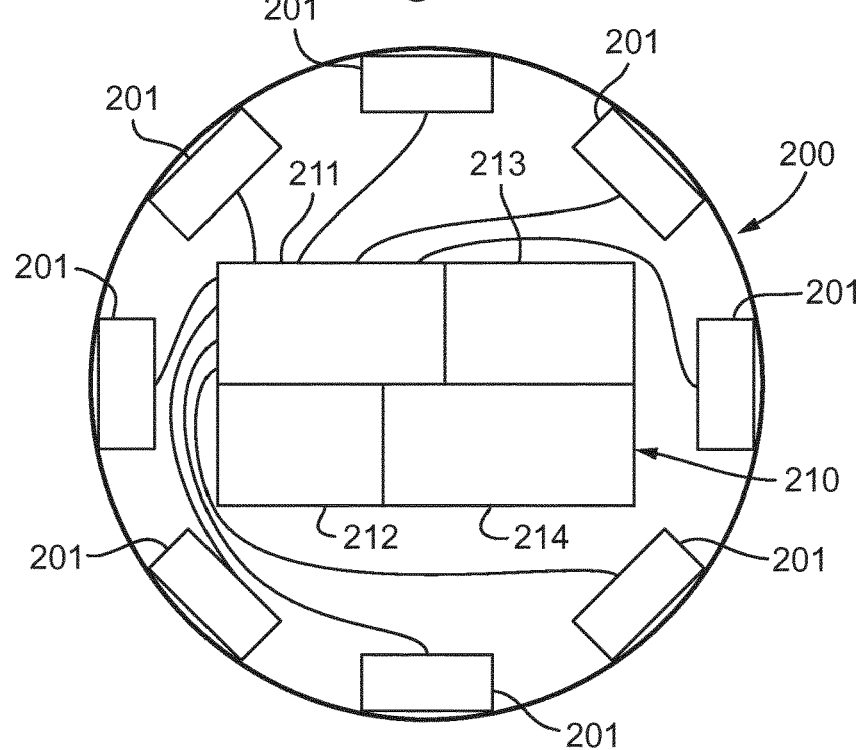
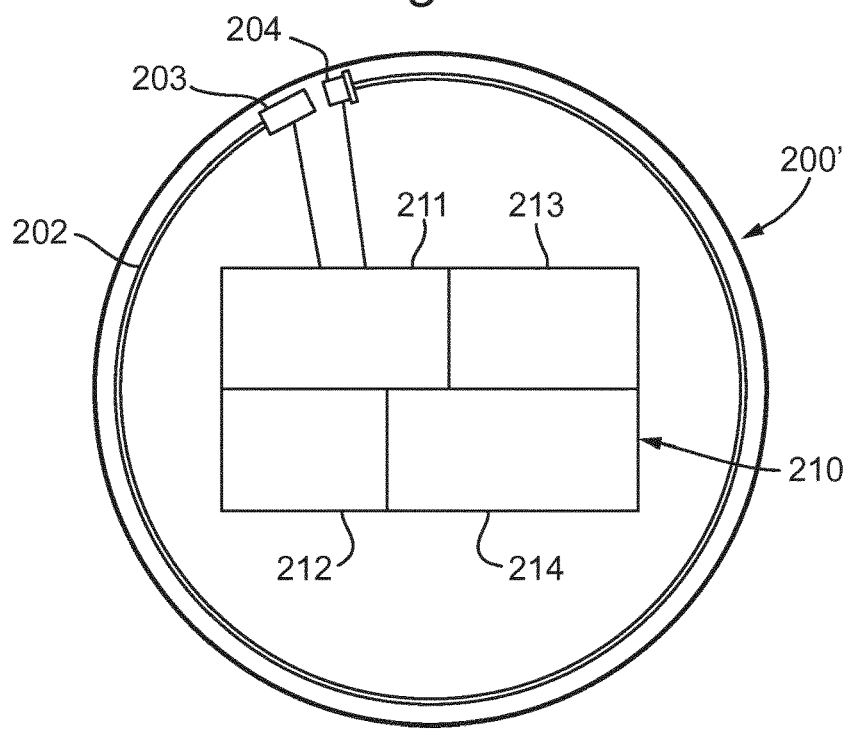

Fig. 6
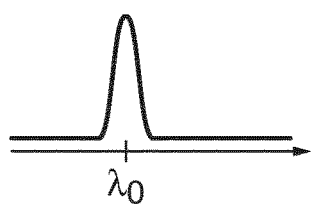
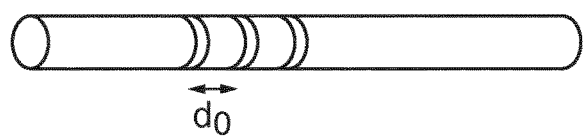
Unstrained Fibre
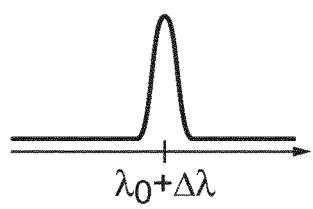
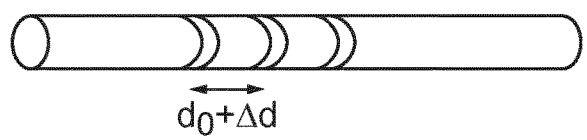
Tensile Strain
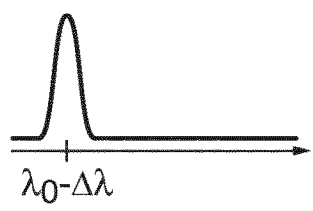
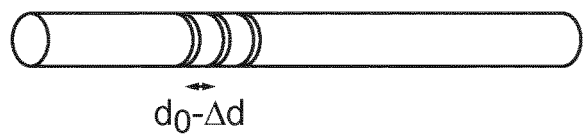
Compressive Strain

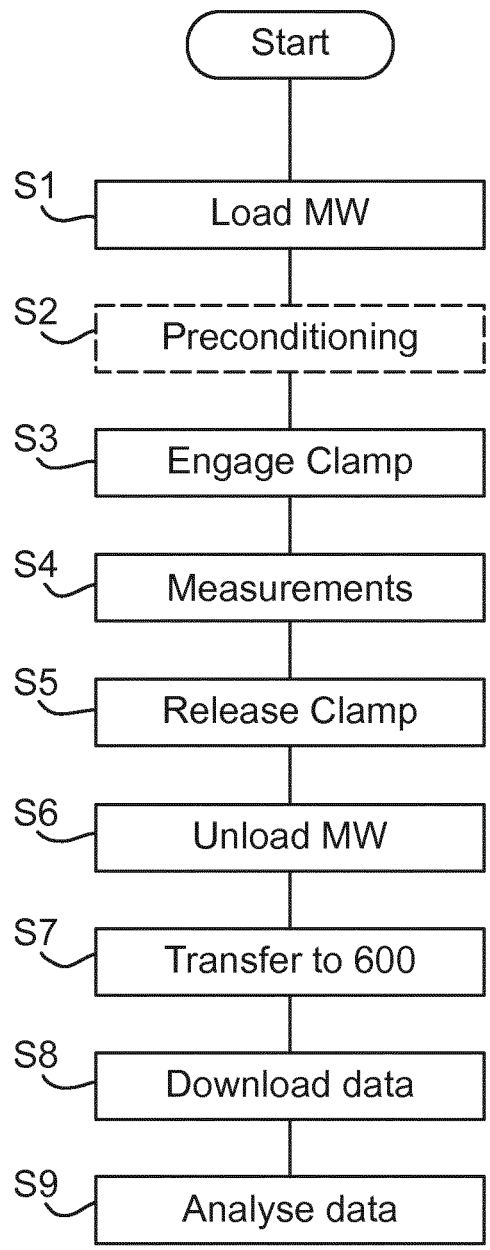

MEASUREMENT SUBSTRATE, A MEASUREMENT METHOD AND A MEASUREMENT SYSTEM

CROSS-REFERENCE TO RELATED APPLICATIONS

This application is the U.S. national phase entry of PCT patent application no. PCT/EP2017/072543, which was filed on Sep. 8, 2017, which claims the benefit of priority of European patent application no. 16196279.0, which was filed on Oct. 28, 2016 and which is incorporated herein in its entirety by reference.

FIELD

The present invention relates to a measurement substrate, a measurement method and a measurement system, for use in a lithographic apparatus, a metrology apparatus or a process apparatus, for example.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Immersion techniques have been introduced into lithographic systems to enable improved resolution of smaller features. In an immersion lithographic apparatus, a liquid layer of a liquid having a relatively high refractive index is interposed in a space between a projection system of the apparatus (through which the patterned beam is projected towards the substrate) and the substrate. The liquid covers at last the part of the wafer under the final lens element of the projection system. Thus, at least the portion of the substrate undergoing exposure is immersed in the liquid. The effect of the immersion liquid is to enable imaging of smaller features since the exposure radiation will have a shorter wavelength in the liquid than gas. (The effect of the liquid may also be regarded as increasing the effective numerical aperture (NA) of the system and also increasing the depth of focus.)

In commercial immersion lithography, the liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the space between the final lens element and a surface facing the final element. The facing surface is a surface of substrate or a surface of the supporting stage (or substrate table) that is co-planar with the substrate surface. (Please note that reference in the following text to surface of the substrate W also refers in addition or in the alternative to a surface of the substrate table, unless expressly stated otherwise; and vice versa). A fluid handling structure present between the projection system and the stage is used to confine the immersion to the immersion space. The space filled by liquid is smaller in plan than the top surface of the substrate and the space remains substantially stationary relative to the projection system while the substrate and substrate stage move underneath. Other immersion systems have been envisaged such as an unconfined immersion system (a so-called 'All Wet' immersion system) and a bath immersion system.

An alternative to immersion lithography is EUV lithography, in which the radiation beam is formed of EUV radiation, e.g. having a wavelength in the range of from 5 nm to 20 nm. EUV radiation can be generated by a plasma source or a free-electron laser, for example. In EUV lithography, the beam path, including the mask and substrate, are kept in a near-vacuum and reflective optical elements are mostly used. This is because EUV radiation is strongly absorbed by most materials. A low pressure of hydrogen gas may be present, e.g. to assist in cleaning contaminants when a plasma source is used.

In a lithographic apparatus, the production substrate, i.e. the substrate which is to be exposed, is usually held by a substrate holder which has a large number of small burls to support the substrate. The burls have a total area much less than the area of the substrate and serve two purposes. Firstly, because their total area is small relative to the area of the substrate any particulate contaminant that might fall on the substrate holder will most probably fall between burls and so will not distort the substrate unless it is larger than the height of the burls. Secondly, it is easier to ensure that the tops of the burls accurately conform to a flat plane than to ensure that a surface as large as the substrate is flat.

When the substrate is loaded onto and removed from the substrate holder, wear is caused to the burls. The rate of wear is unpredictable and is not uniform across the area of the substrate holder. Wear to the burls affects their height and therefore the flatness of the substrate supported by the substrate holder. Unflatness of the substrate during exposures can cause imaging errors such as increased overlay errors, but not in a predictable way.

If wear of the substrate holder is suspected, then wear can be detected by removing the substrate holder from the lithographic apparatus and using a confocal microscope or interferometry to map the surface contour of the substrate holder. This is a very time consuming procedure resulting in excessive downtime for the lithographic apparatus. It is also possible to perform a set of specific test exposures to determine if the substrate holder wear is causing overlay. However these require special reticles and themselves take up a significant amount of time, reducing throughput of the lithographic apparatus.

SUMMARY

It is desirable, for example, to provide means to enable detection of wear of a substrate holder more quickly.

According to an aspect of the invention, there is provided a method of measuring wear of a substrate holder that is configured to hold a production substrate, the method comprising:

clamping a measurement substrate to the substrate holder; and measuring strain in the measurement substrate to generate a measurement result.

According to an aspect of the invention, there is provided a measurement substrate for measuring wear of a substrate holder that is configured to hold a production substrate, the measurement substrate comprising:

a body having dimensions similar to that of the production substrate; and a strain sensor in the body configured to measure strain in a peripheral portion of the measurement substrate.

According to an aspect of the invention, there is provided a measurement system comprising a measurement substrate as described above and a computer program configured to control the measurement substrate and a lithographic apparatus to perform the method described above.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a measurement substrate according to an embodiment;

FIG. 5 depicts a measurement substrate according to an embodiment;

FIG. 6 is a diagram explaining the functioning of a fiber Bragg grating strain sensor;

FIG. 7 is a flow diagram of a measurement method according to an embodiment.

DETAILED DESCRIPTION

Figure 1:
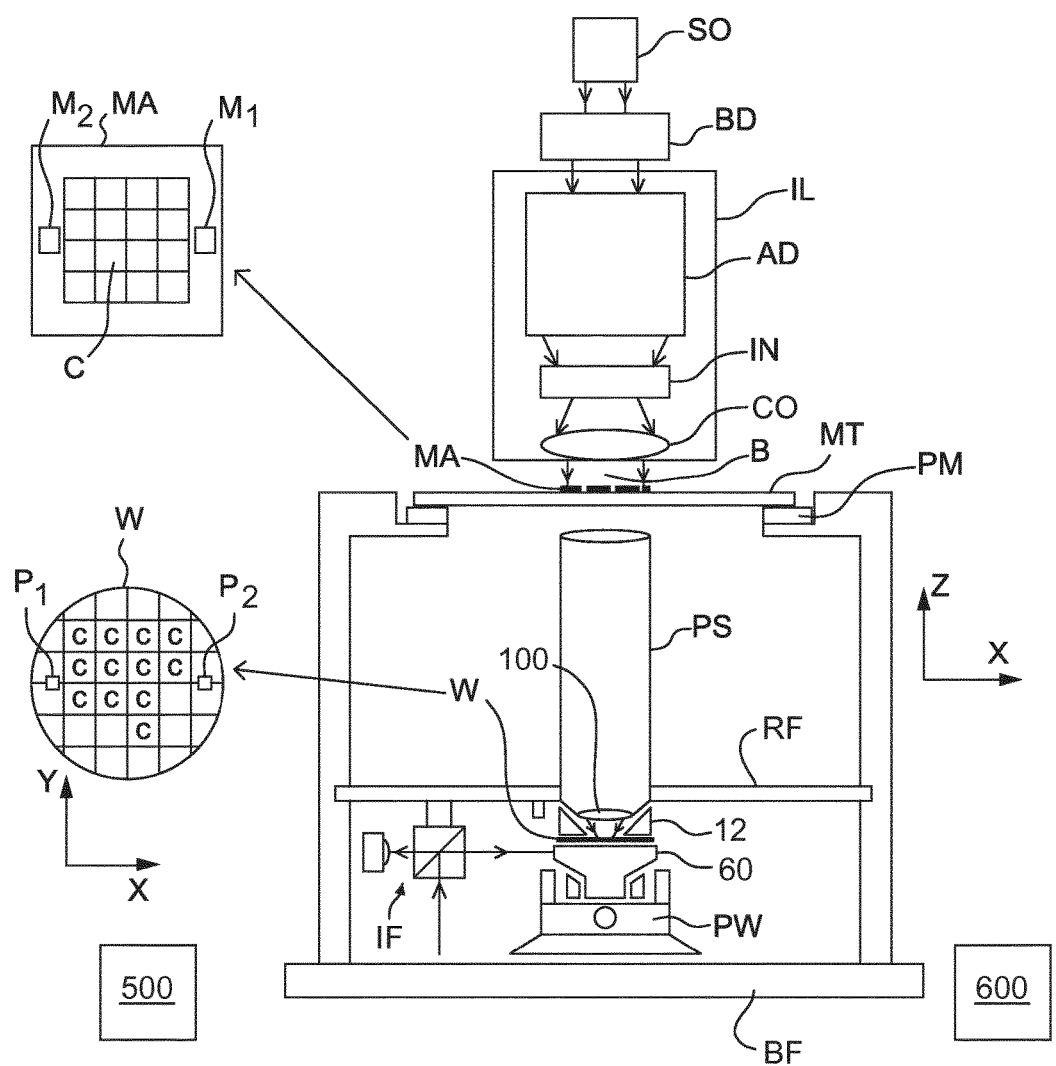
FIG. 1 schematically depicts a lithographic apparatus.

FIG. 1 schematically depicts a lithographic apparatus in which an embodiment of the invention can be used. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan.

In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary.

One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

A download station 600, described further below, is provided as part of the lithographic apparatus or as a separate device elsewhere in the fab, perhaps close to the lithographic apparatus or at a central location. The download station is connected to controller 500, a supervisory control system and/or the overall control system of the fab. The download station can incorporate a computer system programmed to analyze the information obtained from the inspection substrate, or such analysis can be performed elsewhere.

Arrangements for providing liquid between a final lens element of the projection system PS and the substrate can be classed into three general categories. These are the bath type arrangement, the so-called localized immersion systems and the all-wet immersion systems. The present invention relates particularly to the localized immersion systems.

In an arrangement which has been proposed for a localized immersion system, a liquid confinement structure 12 extends along at least a part of a boundary of an immersion space between the final lens element of the projection system PS and the facing surface of the stage or table facing the projection system. The facing surface of the table is referred to as such because the table is moved during use and is rarely stationary. Generally, the facing surface of the table is a surface of a substrate W, substrate table WT which surrounds the substrate or both.

In an embodiment, the liquid confinement structure 12 as illustrated in FIG. 1 may extend along at least a part of a boundary of the immersion space between the final lens element 100 of the projection system PS and the substrate table WT or substrate W. In an embodiment, a seal is formed between the liquid confinement structure 12 and the surface of the substrate W/substrate table WT. The seal may be a contactless seal such as a gas seal 16 or an immersion liquid seal. (A system with a gas seal is disclosed in European patent application publication no. EP-A-1,420,298 which is hereby incorporated by reference in its entirety).

The liquid confinement structure 12 is configured to supply and confine immersion liquid to the immersion space. Liquid may be brought into the immersion space by a liquid inlet and the liquid may be removed by a liquid outlet.

The liquid may be confined in the immersion space by a gas seal. In use the gas seal is formed between the bottom of the liquid confinement structure 12 and the facing surface of the table (i.e. the surface of the substrate W and/or the surface of the substrate table WT). The gas in the gas seal is provided under pressure via an inlet to a gap between the liquid confinement structure 12 and substrate W and/or substrate table WT. The gas is extracted via a channel associated with an outlet. The overpressure on the gas inlet, vacuum level on the outlet and geometry of the gap are arranged so that there is a high-velocity gas flow inwardly that confines the liquid. The force of the gas on the liquid between the liquid confinement structure 12 and the substrate W and/or substrate table WT confines the liquid in the immersion space 10. Such a system is disclosed in United States patent application publication no. US 2004-0207824 which is hereby incorporated by reference in its entirety.

Figure 3:
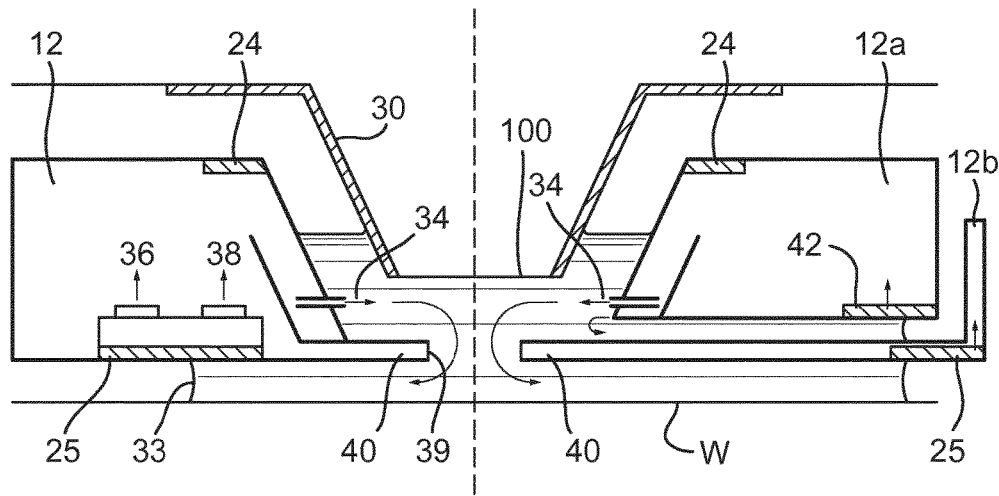
FIG. 3 is a side cross sectional view that schematically depicts a two further immersion liquid confinement structure arrangements for use in a lithographic projection apparatus.

Other immersion liquid confinement structures 12 can be used with embodiments of the present invention, such the arrangement depicted in FIG. 3.

Figure 2:
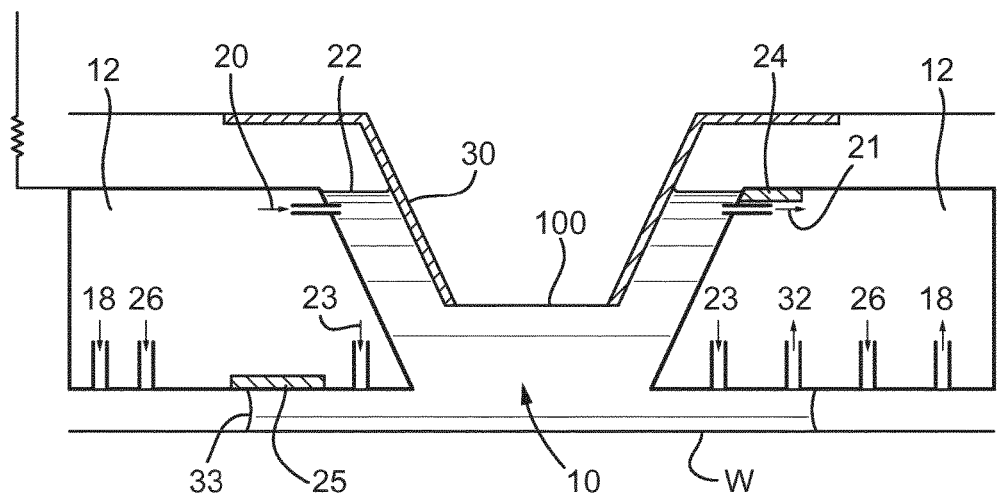
FIG. 2 schematically depicts two immersion liquid confinement structure arrangements for use in a lithographic projection apparatus.

FIGS. 2 and 3 show different features which may be present in variations of the liquid confinement structure 12. The arrangements illustrated in FIG. 2 and described below may be applied to the lithographic apparatus described above and illustrated in FIG. 1. The two different arrangements are shown for features on the bottom left-hand-side and bottom right-hand side of the figure, respectively. Unless mentioned otherwise, the two designs share common features. The designs may share some of the same features as described above unless described differently. The features described herein may be selected individually or in combination as shown or as required.

FIG. 2 shows a confinement structure 12 around the bottom surface of a last lens element. The last lens element 100 has an inverted frustro-conical shape. The frustro-conical shape having a planar bottom surface and a conical surface. The frustro-conical shape protrudes from a planar surface and having a bottom planar surface. The bottom planar surface is the optically active portion of the bottom surface of the last lens element, through which the projection beam may pass. The confinement structure surrounds at least part of the frustro-conical shape. The confinement structure has an inner-surface which faces towards the conical surface of the frustro-conical shape. The inner-surface and the conical surface have complementary shape. A top surface of the confinement structure is substantially planar. The confinement structure may fit around the frustro-conical shape of the last lens element. A bottom surface of the liquid confinement structure is substantially planar and in use the bottom surface may be parallel with the facing surface of the table and/or wafer. The distance between the bottom surface and the facing surface may be in the range of 30 to 500 micrometers, desirably in the range of 80 to 200 micrometers.

The liquid confinement structure 12 extends closer to the facing surface of the wafer W and wafer table WT than the last lens element 100. An immersion space 10 is therefore defined between the inner surface of the liquid confinement structure 12, the planar surface of the frustro-conical portion and the facing surface. During use, the immersion space 10 is filled with liquid. The liquid fills at least part of a buffer space between the complementary surfaces between lens and the liquid confinement structure 12, in an embodiment at least part of the immersion space 10 between the complementary inner-surface and the conical surface.

Liquid is supplied to the immersion space 10 through an opening formed in the surface of the liquid confinement structure 12. The liquid may be supplied through a supply opening 20 in the inner-surface of the liquid confinement structure. Alternatively or additionally, the liquid is supplied from an under supply opening 23 formed in the undersurface of the liquid confinement structure 12. The under supply opening may surround the path of the projection beam and it may be formed of a series of openings in an array. The liquid is supplied to fill the immersion space 10 so that flow through the space under the projection system is laminar. The supply of liquid from the under supply opening 23 under the liquid confinement structure 12 additionally prevents the ingress of bubbles into the immersion space 10. This supply of liquid functions as a liquid seal.

The liquid may be recovered from a recovery opening 21 formed in the inner-surface. The recovery of the liquid through the recovery opening 21 may be by application of an under pressure; the recovery through the recovery opening 21 as a consequence of the velocity of the liquid flow through the space; or the recovery may be as a consequence of both. The recovery opening 21 may be located on the opposite side of the supply opening 20, when viewed in plan. Additionally or alternatively, the liquid may be recovered through an overflow opening 24 located on the top surface of the liquid confinement structure 12, as shown in the right-hand arrangement. Note that if present the overflow may extend around the top of the liquid confinement structure, around the path of the projection beam.

Additionally or alternatively, liquid may be recovered from under the liquid confinement structure 12 through a bottom recovery opening 25, 32. A meniscus 33 forms between the liquid confinement structure 12 and the facing surface and it serves as border between the liquid space and the gaseous external environment. The bottom recovery opening may be a porous plate 25 which may recover the liquid in a single phase flow. The meniscus may be free to move over the surface of the porous plate during relative movement of facing surface relative to the liquid confinement structure. Alternatively, the bottom recovery opening 25, may serve to hold (or 'pin') the liquid meniscus 33 to the liquid confinement structure 12. The bottom recovery opening may be a series of pining openings 32 through which the liquid is recovered. The pining openings 32 may recover the liquid in a two phase flow.

Optionally radially outward, with respect to the inner-surface of the liquid confinement structure 12, is an gas knife opening 26. Gas may be supplied through the gas knife opening 26 at elevated speed to assist confinement of the immersion liquid in the immersion space 12. The supplied gas may be humidified and it may contain carbon dioxide. The supplied gas may consist essentially of carbon dioxide and water vapor. Radially outward of the gas knife opening 26 is a gas recovery opening 18 for recovering the gas supplied through the gas knife opening 26.

FIG. 3 depicts two further arrangements of liquid confinement structure 12. The two different arrangements are shown for features on the bottom left-hand-side and bottom right-hand side of the figure, respectively. Unless mentioned otherwise, the two designs share common features. Features of the two arrangements shown in FIG. 3 which are common to FIG. 2 share the same reference numbers. The liquid confinement structure 12 has an inner surface which complements the conical surface of the frustro-conical shape. The undersurface of the liquid confinement structure 12 is closer to the facing surface than the bottom planar surface of the frustro-conical shape.

Liquid is supplied to the immersion space 10 through supply openings formed in the inner surface of the liquid confinement structure 12. The supply openings 34 are located towards the bottom of the inner surface, perhaps below the bottom surface of the fustro-conical shape. The supply openings 34 are located on an inner surface, spaced apart around the path of the projection beam.

Liquid is recovered from the immersion space 10 through recovery openings 25 in the undersurface of the liquid confinement structure 12. As the facing surface moves under the liquid confinement structure 12, the meniscus 33 may migrate over the surface of the recovery opening 25 in the same direction as the movement of the facing surface. The recovery openings 25 may be formed of a porous member. The liquid may be recovered in single phase. In an embodiment the liquid is recovered in a two phase flow. The two phase flow is received in a chamber 35 within the liquid confinement structure 12 where it is separated into liquid and gas. The liquid and gas are recovered through separate channels 36, 38 from the chamber 35.

An inner periphery 39 of the undersurface of the liquid confinement structure 12 extends into the space away from the inner surface to form a plate 40. The inner periphery forms a small aperture which may be sized to match the shape and size of the projection beam. The plate may serve to isolate liquid either side of it. The supplied liquid flows inwards towards the aperture, through the inner aperture and then under the plate radially outwardly towards the surrounding recovery openings 25.

In an embodiment the liquid confinement structure 12 may be in two parts: an inner part 12a and an outer part 12b. For convenience this arrangement is shown in the right-hand part of FIG. 3. The two parts may move relatively to each other, in a plane parallel to facing surface. The inner part may have the supply openings 34 and it may have the overflow recovery 24. The outer part 12b may have the plate 40 and the recovery opening 25. The inner part may have an intermediate recovery 42 for recovering liquid which flows between the two parts.

In a lithographic apparatus, the substrate W is usually held on a substrate holder during the exposure process. The substrate holder has an upper surface corresponding in shape and size to the substrate W and formed with a plurality of burls to support the substrate W. The burls can have a height in the range of from 5 µm to 500 µm, a diameter in the range of from 0.1 mm to 1.0 mm and a pitch in the range of from 1 mm to 5 mm. The burls can be arranged on a regular array or a pattern that takes account of other features of the substrate holder, e.g. vacuum ports and/or apertures for e-pins which are used in the process of loading and unloading a substrate.

Burls of the substrate holder are subject to wear due to the loading and unloading of substrates as well as cleaning processes. The location and extent of wear is unpredictable. The present inventors have found examples of the rate of wear varying from about 5 nm per year to about 80 nm per year. It is believed that the higher rates of wear are due to loading and unloading of warped wafers, especially so-called umbrella wafers, which cause greater wear on the burls near the outer periphery of the substrate holder.

It is noted that under certain conditions oxide accumulates on the burls near the outer periphery of the substrate holder. This is also considered wear to the burls since it affects their height and therefore the flatness of the substrate supported by the substrate holder.

The present invention proposes a method of measuring wear of a substrate holder that is configured to hold a production substrate, the method comprising:

clamping a measurement substrate to the substrate holder; and measuring strain in the measurement substrate to generate a measurement result.

By measuring the strain in a measurement substrate that is clamped to the substrate holder, it is possible to quickly and easily obtain an indication of wear in the substrate holder, in particular the burls thereof. Measurement of the strain takes very little time at all so that wear of the substrate holder can be detected in little more than the time taken to load and unload a substrate. This is much less than the hours taken by prior techniques.

In addition, the method of the invention does not require the lithographic apparatus to be opened and the substrate holder removed so that the contamination risk of opening the lithographic apparatus is avoided.

The method of the invention can provide more detailed information about the spatial distribution and history of wear of burls than prior methods. This enables wafer load and unload processes and cleaning processes to be improved to minimize wear.

In an embodiment, the measurement substrate comprises a body having dimensions similar to that of the production substrate; and a strain sensor in the body configured to measure strain in a peripheral portion of the measurement substrate.

The peripheral burls tend to wear most so that locating the strain sensor in the peripheral portion of the measurement substrate enables this wear to be detected most easily.

In an embodiment, the strain sensor is a piezo-electric strain sensor. A piezo-electric strain sensor can be configured to detect strain at an accuracy of about 1 nanostrain (i.e. a change in length of 1 nm per m). Therefore a measurement substrate using piezoelectric sensors can detect wear in the substrate holder of the order of a few nm.

In an embodiment, the strain sensor is a fiber Bragg grating strain sensor. A fiber Bragg grating strain sensor can be configured to detect strain at an accuracy of about 1 nanostrain (i.e. a change in length of 1 nm per m). Therefore a measurement substrate using a fiber Bragg strain sensor can detect wear in the substrate holder of the order of a few nm. A single fiber Bragg strain sensor can be located around the periphery of the measurement substrate.

In embodiment, the measurement of strain is repeated after an interval to generate a further measurement result and the measurement result is compared to the further measurement result. Detecting a change in the strain measurement over time is a simple and effective approach to detecting wear of the substrate holder, without necessarily needing to calculate an exact shape of the substrate holder or the measurement substrate. The interval at which the measurement is repeated can be varied according to the expected or experienced rate of wear, for example the measurement may be repeated at a frequency in the range of from once per day to once per year, e.g. once per week. The frequency of measurements can be based on the number of production substrates processed rather than time. The frequency of measurements can varied according to the type or characteristics of the production substrates, for example more frequent measurements can be performed when production substrates that exhibit or are prone to unflatness are processed.

In an embodiment, the substrate holder is located on a substrate table of a lithographic apparatus, in particular, a lithographic apparatus which has a measurement station and an exposure station and the measurement of strain is performed at the measurement station. By performing the measurement of strain at the measurement station it can be done very quickly and so minimize the amount of time that is take up by the detection of wear.

In an embodiment, the clamping is performed with a clamping system that is used to clamp the production substrate to the substrate holder. The clamping force used to hold a production substrate for exposures has been found to be sufficient to allow the detection of wear whilst not itself causing additional wear or damage.

In an embodiment remedial action is performed if the result of the measuring indicates excessive wear of the substrate holder. Remedial action may include replacement, refurbishment or repair of the substrate holder.

The measurement substrate of the present invention can also be used to calibrate machine-to-machine or substrate holder-to-substrate holder overlay fingerprints. In this case, a change in the shape of the substrate holder as detected by the measurement substrate can be a trigger to update overlay compensation applied during exposures.

In an embodiment, the results of the measurement of strain are used to predict the wear of the substrate holder at a future time, e.g. the time of a planned maintenance operation. By predicting future wear it can be determined in advance when remedial action is needed so, for example, this can be planned to be done at a scheduled maintenance period, avoiding any additional down time of the lithographic apparatus.

In an embodiment, the body of the measurement substrate has first thickness in first part thereof and a second thickness in a second part thereof, the first thickness being less that the second thickness and the first part being located so as to increase deformation of the body when clamped to a non-flat substrate holder. In this way the sensitivity of the measurement substrate to wear of the substrate holder can be maximized.

An embodiment of the invention comprises a measurement system comprising a measurement substrate as described above and a computer program configured to control the measurement substrate and a lithographic apparatus to perform the measurement method described above. The computer program can comprise separate modules that are executed by a controller of the measurement substrate and the lithographic apparatus. The computer program can include one or more separate modules that are executed by other computing devices. A module that is executed by the lithographic apparatus can be delivered as an update to control software of the lithographic apparatus.

FIG. 4 depicts a measurement substrate according to an embodiment of the present invention. Measurement substrate 200 comprises a body which is compatible with a lithographic apparatus. For example, the body may be substantially circular, planar body with a diameter of 300 mm. The body can meet standard specifications for thickness and flatness of a production substrate, so that it can be loaded as if it were a standard process substrate. Since it is not necessary to perform exposures on the measurement substrate, nor even to transfer it to the exposure station of a dual-stage lithographic apparatus, the measurement substrate need not strictly conform to standards for a production substrate in all respects. In particular, the measurement substrate can be thicker than a standard production substrate, and need not be resistant to the immersion liquid (if used) or the exposure radiation.

Formed or embedded in the body are a plurality of strain sensors 201. Strain sensors 201 are arranged around the outer periphery of the body. In an embodiment, the body has a radius of 150 mm and the strain sensors are located at a radius in the range of from about 146 mm to 148 mm. For a measurement substrate having a different radius, this range would be scaled accordingly. It is desirable that the strain sensors are located as close as possible to the outer circumference of the body. The outermost burls of the substrate holder tend to wear most, therefore the distortion of a substrate clamped to a worn substrate holder is greatest at its outer circumference.

In an embodiment, body is a silicon substrate and strain sensors 201 are formed directly on an upper surface of the body or in recesses formed in the body. Strain sensors 201 can be MEMS piezoelectric strain sensors and are desirably configured to measure strain of about 1 to 10 nanostrain (nm/m). In an embodiment, a temperature sensor, e.g. a negative temperature coefficient (NTC) temperature sensor, is provided adjacent each piezoelectric strain sensor to enable compensation for any temperature variations that may occur. Piezoresistive strain sensors can also be used in place of or in addition to piezoelectric strain sensors.

In an embodiment, the body 200 is a circular disc of constant thickness, e.g. in the range of 500 nm to 1 mm. The body 200 may be provided with a notch of standard size to allow the measurement substrate to be automatically oriented by the lithographic apparatus. In an embodiment, the body 200 is shaped to increase its sensitivity to wear of the burls of the substrate holder. For example the body 200 may be thinner in some or all of the peripheral region so that it bends more easily when clamped to the substrate holder. Thinning of the body can be done by chemical or mechanical processes as known.

In an embodiment, the body 200 is a silicon wafer but other materials may also be used.

A control module 210 controls the overall operation of the measurement substrate. Although depicted as larger than a strain sensor 201 control module 210 can be smaller and located at any convenient location of the body 120. Control module 210 can be located on the opposite surface of the body from the sensor modules.

Control module 210 comprises sensor interface 211, data storage 212, power supply 213 and data interface 214. Sensor interface 211 connects to strain sensors 201 to provide power and receive measurement signals. The exact form of sensor interface 211 depends on the type of strain sensors used. For piezo-electric strain sensors, sensor interface 211 can comprise one or more amplifiers and analog-to-digital converters. Data storage 212 can comprise EEPROM or NAND flash memory, for example, and stores the measurement results until they can be downloaded. Power supply 213 can be a thin-film battery or supercapacitor, for example. Since the measurement process is very quick, power supply 213 does not need to have a particularly high capacity. Data interface 214 connects to download station 600 and may comprise any convenient form of wired (e.g. MicroUSB) or wireless (e.g. Bluetooth™) interface, for example.

FIG. 5 depicts another measurement substrate according to an embodiment of the invention. Parts that are the same as the measurement substrate of FIG. 4 are not described again in the interests of brevity. Instead of a plurality of strain sensors 201, the measurement substrate 200' of FIG. 5 has a fiber Bragg grating strain sensor 202 disposed around the periphery of measurement substrate 200'. In an embodiment, measurement substrate 200' has a radius of 150 mm and fiber Bragg grating sensor 202 is located at a radius in the range of from 146 mm to 148 mm. A laser diode 204 is coupled to the fiber and provides an input signal. A photodiode 203 is coupled to the other end of the fiber and detects the output.

The principle of operation of a fiber Bragg grating strain sensor is depicted in FIG. 6. The fiber Bragg grating strain sensor has a plurality of gratings each of which is formed by alternate sections of high and low refractive index. The grating period do when the fiber is unstrained is determined so as to reflect or transmit a reference wavelength 4. If the fiber is strained then the grating period increases (tensile strain) or decreases (compressive strain) by a certain amount Δd and so the reflected or transmitted wavelength is likewise changed by a corresponding amount Δλ. The shift in the reflected or transmitted wavelength can be detected, e.g. using a scanning laser diode source. More details of a fiber Bragg grating sensor configured to detect nanostrain are given in International Patent Application number PCT/EP2016/060002, which document is hereby incorporated by reference.

FIG. 7 depicts a method of use of the measurement substrate.

The measurement substrate is loaded 51 into the lithographic apparatus in exactly the same way as a resist-coated substrate is loaded for exposure. Measurement substrate is placed onto substrate table WT by a substrate handler. The measurement substrate desirably has a notch conforming to the standard for production substrates so that it is automatically loaded onto the substrate holder in the same orientation every time.

Once loaded into the lithographic apparatus and placed on the substrate table WT, measurement substrate may be subjected to temperature conditioning S2. Pre-qualification steps that are normally carried out for a production substrate, e.g. flatness measurements, to validate the measurement substrate and verify that it will not damage the lithographic apparatus need not be carried out. Desirably the same temperature conditioning process is performed on the measurement substrate as for a production substrate. In a dual station lithographic apparatus the measurement substrate remains at the measurement station and need not be transferred to an exposure station.

The measurement substrate is then clamped S3 to the substrate holder using the clamping system normally used for a production substrate. The clamping system can be a vacuum clamp or an electrostatic clamp, for example. Desirably, the same clamping force is applied to the measurement substrate as is normally applied to a production substrate. A higher force can be applied if desired to increase sensitivity but at the risk of increasing wear. A lower force can be applied if the measurement substrate is sufficiently sensitive and advantageously reduces wear. The measurement substrate starts taking and recording S4 measurements.

Once all desired measurements have been collected, the clamp system is released S5 and measurement substrate is unloaded S6 from the apparatus in the same way as a production substrate. However rather than being sent to a track for processing, measurement substrate is transferred S7 to a download station 600. At the download station 600 data of the stored measurements can be downloaded S9 from data storage 212 via data interface 214. Data interface 214 may connect to an interface in the download station via a wireless communication technique, such as Wi-Fi™ or Bluetooth™. Power supply 213 can be recharged at the download station, e.g. via a wireless induction charging system. Alternatively, the lower surface of measurement substrate can be provided with electrical contacts for both downloading of data of images and/or measurements from data storage 212 and for charging power supply 213.

The downloaded data is then analyzed S9 to identify any wear or damage to the substrate holder. Analysis of the downloaded data can be manual, automatic or a combination of manual and automatic processes. Automatic analysis may include pattern recognition or comparison with reference data. This process is repeated at a desired frequency in the range of from once per day to once per year, e.g. once per week.

In an embodiment of the present invention, the measurement substrate is used with a lithographic apparatus which has not been designed with the measurement substrate in mind so that no specific means are provided for the lithographic apparatus to communicate with or control the measurement substrate when it is in lithographic apparatus. Therefore, the measurement substrate desirably operates autonomously. In an embodiment of the present invention, the measurement substrate is configured to record measurements as soon as it is switched on prior to loading into the lithographic apparatus and continue until it is unloaded and connected to the download station 600.

In an embodiment, the measurement substrate is programmed to record measurements for specific time periods which may be defined relative to an included clock or an initiating event. The time periods for measurement recording are predetermined to match the timings of a predetermined program of movements of the measurement substrate through the lithographic apparatus.

In an embodiment, the measurement substrate is configured to determine when it is correctly located to begin capturing measurements. Other sensors can be provided to enable the measurement substrate to determine its location within the lithographic apparatus.

In an embodiment, the lithographic apparatus is provided with a communication device for communicating with the measurement substrate when the measurement substrate is loaded on the substrate table. The communication means may be a wireless communication means, e.g. Wi-Fi™ or Bluetooth™ or a wired connection via the underside of the measurement substrate. If a wired connection can be provided, power may also be provided to the measurement substrate avoiding the need to provide a power supply 213 in the measurement substrate. A communication device can be retrofitted to an existing lithographic apparatus.

If a communication device is provided in the lithographic apparatus it can be used to instruct the measurement substrate to begin capturing measurements and also to download captured measurement data. In an embodiment, data captured by the measurement substrate is downloaded and analyzed in parallel with the exposures. This allows remedial action to be carried out immediately a problem is detected.

Although the present invention has been described above in relation to use of the measurement substrate to measure wear of a substrate holder in a lithographic apparatus, the measurement substrate can also be used to measure wear of a substrate holder in another apparatus, such as a metrology apparatus. A measurement substrate according to an embodiment can be used in a test bed or partial apparatus.

In an embodiment, there is provided a method of measuring wear of a substrate holder that is configured to hold a production substrate, the method comprising: clamping a measurement substrate to the substrate holder, the measurement substrate comprising a body having dimensions similar to that of the production substrate; and measuring strain in a peripheral portion of the measurement substrate to generate a measurement result.

In an embodiment, the method further comprises repeating the measurement of strain after an interval to generate a further measurement result and comparing the measurement result and the further measurement result. In an embodiment, the substrate holder is located on a substrate table of a lithographic apparatus and the clamping is performed with a clamping system that is used to clamp the production substrate to the substrate holder. In an embodiment, the method further comprises performing remedial action if the result of the measuring indicates excessive wear of the substrate holder. In an embodiment, the method further comprises using the results of the measurement of strain to predict the wear of the substrate holder at a future time.

In an embodiment, there is provided a measurement substrate for measuring wear of a substrate holder that is configured to hold a production substrate, the measurement substrate comprising: a body having dimensions similar to that of the production substrate; and a strain sensor in the body configured to measure strain in a peripheral portion of the measurement substrate.

In an embodiment, the body comprises a plurality of strain sensors arranged around the outer periphery of the body. In an embodiment, the strain sensor comprises a piezoelectric strain sensor. In an embodiment, the body comprises a temperature sensor adjacent to the piezo-electric strain sensor. In an embodiment, the strain sensor comprises a fiber Bragg grating strain sensor. In an embodiment, the body has a first thickness in a first part thereof and a second thickness in a second part thereof, the first thickness being less that the second thickness and the first part being located so as to increase deformation of the body when clamped to a non-flat substrate holder. In an embodiment, the first part is in the peripheral region of the body.

In an embodiment, there is provided a measurement system comprising: a measurement substrate as described herein, a computer program configured to control the measurement substrate, and a lithographic apparatus configured to perform a method as herein.

In an embodiment, there is provided a lithographic apparatus comprising: a substrate holder located on a substrate table, the substrate holder for holding a measurement substrate as described herein, and a measurement station for measuring strain in a peripheral portion of the measurement substrate, wherein the measurement of strain is performed by a method as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A method of measuring wear of a substrate holder that is configured to hold a production substrate, the method comprising:
clamping a measurement substrate to the substrate holder, the measurement substrate comprising a body having dimensions similar to that of the production substrate; and measuring strain in a peripheral portion of the measurement substrate to generate a measurement result representing wear of the substrate holder.

2. The method according to claim 1, further comprising repeating the measurement of strain after an interval to generate a further measurement result and comparing the measurement result and the further measurement result.

3. The method according to claim 1, wherein the substrate holder is located on a substrate table of a lithographic apparatus and the clamping is performed with a clamping system that is used to clamp the production substrate to the substrate holder.

4. The method according to claim 1, further comprising performing remedial action responsive to a result of the measuring that indicates excessive wear of the substrate holder.

5. The method according to claim 1, further comprising using the results of the measurement of strain to predict the wear of the substrate holder at a future time.

6. The method according to claim 1, wherein the measurement substrate has a strain sensor in a body of the measurement substrate, the strain sensor configured to measure strain in the peripheral portion of the measurement substrate.

7. The method according to claim 6, wherein the body comprises a plurality of strain sensors arranged along the outer periphery of the body.

8. The method according to claim 6, wherein the strain sensor comprises a piezo-electric strain sensor.

9. The method according to claim 8, wherein the body comprises a temperature sensor adjacent to the piezo-electric strain sensor.

10. The method according to claim 6, wherein the strain sensor comprises a fiber Bragg grating strain sensor.

11. The method according to claim 1, wherein a body of the measurement substrate has a first thickness in a first part thereof and a second thickness in a second part thereof, the first thickness being less than the second thickness and the first part being located so as to increase deformation of the body when clamped to a non-flat substrate holder.

12. A measurement substrate for measuring wear of a substrate holder that is configured to hold a production substrate, the measurement substrate comprising:
a body having dimensions similar to that of the production substrate; and
a strain sensor in the body configured to measure strain in a peripheral portion of the measurement substrate.

13. The measurement substrate according to claim 12, wherein the body comprises a plurality of strain sensors arranged along the outer periphery of the body.

14. The measurement substrate according to claim 12, wherein the strain sensor comprises a piezo-electric strain sensor.

15. The measurement substrate according to claim 14, wherein the body comprises a temperature sensor adjacent to the piezoelectric strain sensor.

16. The measurement substrate according to claim 12, wherein the strain sensor comprises a fiber Bragg grating strain sensor.

17. The measurement substrate according to claim 12, wherein the body has a first thickness in a first part thereof and a second thickness in a second part thereof, the first thickness being less than the second thickness and the first part being located so as to increase deformation of the body when clamped to a non-flat substrate holder.

18. The measurement substrate according to claim 17, wherein the first part is in the peripheral portion of the body.

19. A measurement system comprising:
the measurement substrate according to claim 12,
a computer program, upon execution by a computer system, configured to at least:
cause clamping of the measurement substrate to the substrate holder, and
measure strain in a peripheral portion of the measurement substrate to generate a measurement result representing wear of the substrate holder.

20. A lithographic apparatus comprising:
the measurement system according to claim 19; and
a substrate holder located on a substrate table, the substrate holder for holding the measurement substrate.

* * * * *